United States Patent [19]

Suzuki et al.

[11] Patent Number: 4,546,452
[45] Date of Patent: Oct. 8, 1985

[54] MAGNETIC BUBBLE DEVICE

[75] Inventors: Ryo Suzuki, Kodaira; Teruaki Takeuchi, Kokubunji; Naoki Kodama; Masatoshi Takeshita, both of Hachioji; Yutaka Sugita, Tokorozawa, all of Japan

[73] Assignee: Hitachi, Ltd., Tokyo, Japan

[21] Appl. No.: 544,138

[22] Filed: Oct. 21, 1983

[30] Foreign Application Priority Data

Oct. 22, 1982 [JP] Japan ................................. 57-184551

[51] Int. Cl.⁴ .............................................. G11C 19/08
[52] U.S. Cl. ......................................... 365/36; 365/16
[58] Field of Search .............................. 365/15, 16, 36

[56] References Cited

U.S. PATENT DOCUMENTS 4,086,572  4/1978  Bullock ................................. 365/36
4,360,904  11/1982 Gergis ................................. 365/36

Primary Examiner—James W. Moffitt
Attorney, Agent, or Firm—Antonelli, Terry & Wands

[57] ABSTRACT

A magnetic bubble device in which a first propagation path having a cyclic shape formed by selectively implanting ions into a magnetic film capable of holding magnetic bubbles and a second propagation path including soft magnetic material elements are arranged on the same chip. A soft magnetic material element having a length in the direction perpendicular to the direction of bubble propagation in the first propagation path which is not less than 2.5 times the period of the first propagation path is included in the junction between the first and second propagation paths.

3 Claims, 7 Drawing Figures

MAGNETIC BUBBLE DEVICE

BACKGROUND OF THE INVENTION

The present invention relates to a composite type magnetic bubble device in which soft magnetic material propagation paths and propagation paths (ion implantation propagation paths) formed by selectively implanting ions are arranged in the same clip and, more particularly, to a junction which is suitable for transferring magnetic bubbles from the ion implantation propagation path to the soft magnetic material propagation path.

A composite type magnetic bubble device is disclosed in U.S. patent application Ser. No. 375,344 (filed on May 5, 1982) based on Japanese patent application Ser. No. 69444/81. A junction between an ion implantation propagation path and a soft magnetic material propagation path is, in particular, disclosed in U.S. patent application Ser. No. 446,518 (filed on Dec. 3, 1982), now U.S. Pat. No. 4,453,231, based on Japanese patent application Ser. No. 194520/81. Both applications have been assigned to the assignee of the present application.

In such a junction, to ensure propagation of magnetic bubbles from the ion implantation propagation path to the soft magnetic material propagation path, the driving force of the soft magnetic material propagation path must be stronger than that of the ion implantation propagation path at the connecting point between them.

SUMMARY OF THE INVENTION

An object of the present invention is, on the basis of the finding of the conditions under which propagation of magnetic bubbles from an ion implantation propagation path defined by selectively implanting ions into a magnetic film to a soft magnetic material propagation path formed on the magnetic film, to provide a composite type magnetic bubble device having a sufficiently large operation margin.

In one aspect of the present invention, a junction element of a soft magnetic material is formed between an ion implantation propagation path and a soft magnetic material propagation path, in which the length measured in the direction perpendicular to the general direction of bubble propagation in the elongate ion implantation propagation path having a cyclic shape is not less than about 2.5 times the period of the ion implantation propagation path.

DESCRIPTION OF THE PREFERRED EMBODIMENTS

Figure 1:
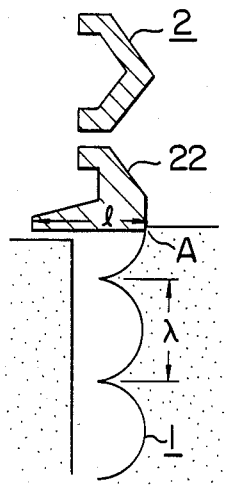
FIG. 1 is a diagram showing a junction between an ion implantation propagation path and a soft magnetic material propagation path in a magnetic bubble device of the type disclosed in the above-described prior applications.

FIG. 1 shows a structure constituting part of subject matters of the previously-described prior applications, in which a soft magnetic material propagation path and an ion implantation propagation path are mutually connected.

An ion implantation propagation path 1 is defined by ion implantation regions which are formed by covering desired portions of a magnetic film (e.g. garnet film, not shown) by a mask having a cyclic shape and by selectively implanting neon, helium, or other ions into the magnetic film. Therefore, the ion implantation propagation path 1 forms an elongate bubble propagation path of an elongate cyclic shape having a period $\lambda$. This ion implantation propagation path 1 is connected through a junction 22 (which, in the present specification, will be referred to as a junction element to describe the present invention) with the elongate bubble propagation path 2 including a series of elements of a soft magnetic material (e.g. permalloy) formed on the surface of the magnetic film. The junction element 22 is also made of a soft magnetic material (e.g. permalloy) formed on the surface of the magnetic film.

The propagation path 1, junction element 22 and propagation path 2 are arranged substantially in line with one another. The arrangement of the junction element 22 and the path 2 are such that bubbles propagated in the ion implantation propagation path 1 are simultaneously subjected to the driving force of the ion implantation propagation path 1 and the driving force of the junction element 22 at the connecting point A. That is to say, they are arranged in such a manner that the location of a charged wall which is produced at the end portion of the ion implantation region forming the ion implantation propagation path due to the rotating magnetic field for driving the magnetic bubbles overlaps the location of the magnetic pole which occurs in the junction element 22 of a soft magnetic material at the connecting point A.

Figure 2:
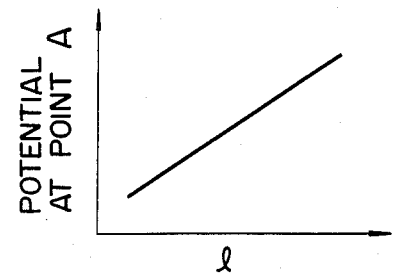
FIG. 2 is a diagram showing a relation between the potential at the junction point of a soft magnetic material layer and an ion implantation propagation path and the length of the junction measured in the direction perpendicular to the length of or the general direction of the bubble propagation in the ion implantation propagation path at the connecting portion between the soft magnetic material layer and the ion implantation propagation path.

The present inventors investigated the depth of the potential at the connecting point A using length l, as a parameter, of the portion to be connected to the propagation path 1 of the junction element 22, which length is measured in the direction perpendicular to the general direction of bubble propagation, i.e. in the direction of the length of the elongate ion implantation propagation path 1. As a result of this investigation, it has been found that the potential becomes deep with an increase in l as shown in FIG. 2. As the potential becomes deep, the force to attract the magnetic bubbles becomes strong; therefore, the larger l is, the more easily will the magnetic bubbles propagate from the ion implantation propagation path 1 to the soft magnetic material junction element 22.

Figure 3:
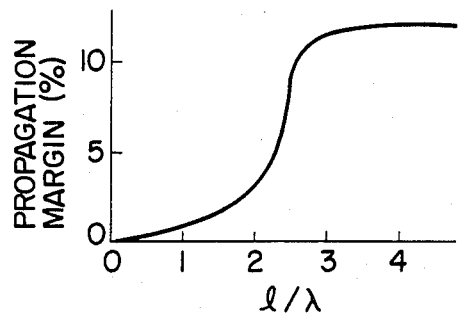
FIG. 3 is a diagram showing a relation between the above-mentioned length at the connecting portion and a propagation margin.

Referring to FIG. 3, there is shown a result of investigation of a propagation margin of the magnetic bubble device with respect to the period $\lambda$ of the ion implantation propagation path having a cyclic shape when soft magnetic material elements having various values of l each of which constitutes the junction element 22 are used. It will be understood that as $1/\lambda$ approaches 2.5, the propagation margin is rapidly increasing. The propagation margin is saturated when $1/\lambda$ is 2.5 or more, and this is because the propagation margin when the above-mentioned junction element was used is restricted due to the propagation margin of the ion implantation propagation path. It will be understood from this result that the propagation margin is made maximum by making the length 1 of the junction element measured in the direction perpendicular to the direction of the bubble propagation (lengthwise direction) of the ion implantation propagation path or of the soft magnetic material propagation path is not less than about 2.5 times the period $\lambda$ of the ion implantation propagation path having a cyclic shape, the junction element being arranged between the ion implantation propagation path and the soft magnetic material path.

Figure 4:
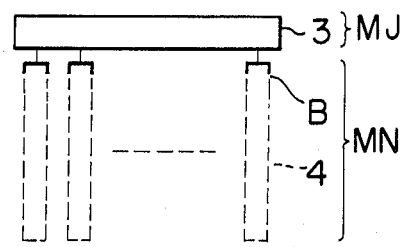
FIG. 4 is a diagram illustrating a major/minor loop structure to which the present invention may be applied.
Figure 5:
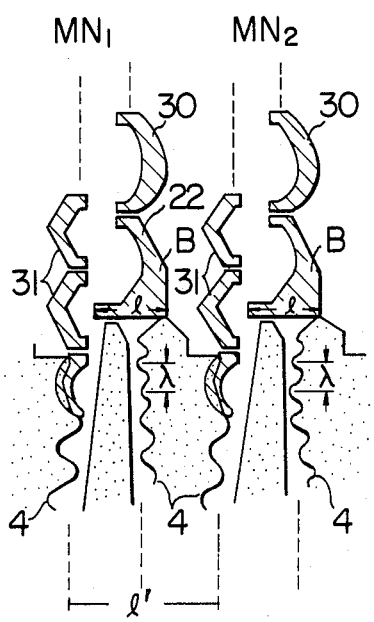
FIG. 5 is a diagram showing part of the minor loop.
Figure 6A:
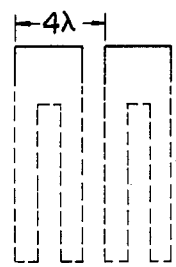
FIGS. 6A and 6B are diagrams showing embodiments of the present invention.
Figure 6B:
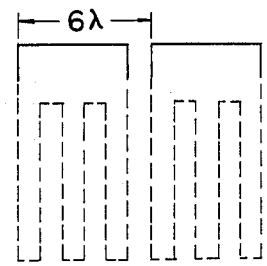

A magnetic bubble memory generally has a major/minor loop structure as shown in FIG. 4. A reference character MJ denotes a major loop and MN denotes a plurality of minor loops. In the drawing, ion implantation propagation paths 4 are indicated by broken lines and soft magnetic material propagation paths 3 are indicated by solid lines. The junction elements 22 are arranged at one or more of the locations B. Namely, each of such minor loops consists of a soft magnetic material propagation path, a junction element and an ion implantation propagation path interconnected with the soft magnetic material path through the junction element. It should be noted that the greater part of each minor loop is constituted by ion implantation propagation paths and $\lambda$ represents the period of the cyclic shape of the ion implantation propagation paths constituting the substantial part of the minor loop. Although the distance between the minor loops may be set for an arbitrary value within a certain range, it is undesirable that its distance exceeds almost 2.5 times the period $\lambda$ of the ion implantation propagation path in consideration of the fact that the recording density must be raised as high as possible while suppressing the unnecessary repulsive force between magnetic bubbles as low as possible. However, when the distance between the minor loops is set for 2.5 $\lambda$ with the minor loop structure of FIG. 4, it will be impossible to set $1/\lambda$ for 2.5 or more. An example of the junction element is shown in FIG. 5 and will be described using this illustration. In FIG. 5, portions of two adjacent minor loops $MN_1$ and $MN_2$ are shown. Each minor loop includes a soft magnetic material propagation path having soft magnetic material elements 30 and 31, soft magnetic material junction element B, and ion implantation propagation path 4. To obtain $1/\lambda$ not less than 2.5, distance $1'$ between the adjacent minor loops $MN_1$ and $MN_2$ has to be larger than $5\lambda$ in consideration of the distance between the opposing soft magnetic material elements 31 and 30 and B in each loop and the distance between the soft magnetic material junction element B in one minor loop $MN_1$ and the soft magnetic material element 31 in the adjacent minor loop $MN_2$. However, it is undesirable to simply set the distance between the minor loops for not less than $5\lambda$ since an unnecessary space appears for the ion implantation propagation path in the minor loop and an inherent advantage of the high-density structure is set off. To solve this problem it is advantageously constituted such that a minor loop is folded a plurality of times. Embodiments with such a structure are shown in FIGS. 6A and 6B. An embodiment of FIG. 6A has a structure in which each minor loop is once folded, wherein the four (or two pairs of) ion implantation propagation paths indicated by the broken lines are juxtaposed and are mutually connected in series to form a loop together with the soft magnetic material junction elements and soft magnetic material propagation paths indicated by the solid lines. A distance between the minor loops is set for, e.g. $4\lambda$. An embodiment shown in FIG. 6B has the same structure as FIG. 6A except that each minor loop is folded twice to include six (or three pairs of) ion implantation paths, in which the distance between minor loops is e.g. $6\lambda$. The period with which each minor loop made of ion implantation propagation paths is folded may be set for about $2\lambda$. It will be easily understood from these embodiments of FIGS. 6A and 6B that in a device having a major/minor loop structure, it is preferable that a minor loop is folded twice or more times to obtain $1/\lambda$ of not less than 2.5 with respect to a length 1 of the soft magnetic material element in the junction.

According to the present invention, the propagation margin in the junction can be made large enough and therefore the operation margin of the composite type magnetic bubble memory can be advantageously made sufficiently large.

We claim:

1. A magnetic bubble device comprising a magnetic film capable of holding magnetic bubbles therein, at least one first elongate propagation path of a cyclic shape defined by selective ion implantation of said magnetic film, said cyclic shape having a period equal to a length $\lambda$, at least one second elongate propagation path each including a series of soft magnetic material elements formed on one surface of said magnetic film, and at least one junction element of a soft magnetic material formed between said first and second elongate propagation paths on the surface of said magnetic film for interconnecting them, said first elongate propagation path, said junction element and said second elongate propagation path being arranged substantially in line with one another, wherein that portion of said junction element which is coupled to said first elongate propagation path has a length measured in the direction perpendicular to the general direction of bubble propagation in said first propagation path not less than about 2.5 $\lambda$.

2. A magnetic bubble device according to claim 1, in which said first and second propagation paths constitute a plurality of loops, at least one of said loops including no less than two pairs of juxtaposed loop propagation path portions connected in series to form said loop, each of said loop propagation path portions being constituted by said first propagation path.

3. A magnetic bubble device according to claim 1, wherein said at least one second elongate propagation path has at least a portion thereof extending in the same direction as the direction or propagation of said at least one first elongate propagation path for enabling bubble propagation in the same direction as said at least one first elongate propagation path.

* * * * *